United States Patent
Gupta

(10) Patent No.: US 9,830,958 B2
(45) Date of Patent: Nov. 28, 2017

(54) TIME-MULTIPLEXED COMMUNICATION PROTOCOL FOR TRANSMITTING A COMMAND AND ADDRESS BETWEEN A MEMORY CONTROLLER AND MULTI-PORT MEMORY

(75) Inventor: Alok Gupta, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/463,717

(22) Filed: May 3, 2012

(65) Prior Publication Data

US 2013/0297864 A1    Nov. 7, 2013

(51) Int. Cl.
G06F 12/02 (2006.01)
G11C 7/10 (2006.01)
G11C 7/22 (2006.01)
G11C 11/4076 (2006.01)

(52) U.S. Cl.
CPC .......... *G11C 7/1042* (2013.01); *G11C 7/1072* (2013.01); *G11C 7/1075* (2013.01); *G11C 7/22* (2013.01); *G11C 11/4076* (2013.01)

(58) Field of Classification Search
CPC .................................................. G06F 12/0853
See application file for complete search history.

(56) References Cited

U.S. PATENT DOCUMENTS

| 6,088,753 | A  | * | 7/2000  | Sheafor et al. ............... 710/306 |
| 7,460,545 | B1 | * | 12/2008 | Calderon ................ H04J 3/062 370/321 |
| 8,161,249 | B1 | * | 4/2012  | Elkins .............. H03K 19/17736 326/38 |
| 2012/0106228 | A1 | * | 5/2012 | Lee ................................ 365/63 |

* cited by examiner

*Primary Examiner* — Edward Dudek, Jr.
*Assistant Examiner* — Ryan Dare
(74) *Attorney, Agent, or Firm* — Artegis Law Group, LLP

(57) ABSTRACT

One embodiment sets forth a technique for time-multiplexed communication for transmitting command and address information between a controller and a multi-port memory device over a single connection. Command and address information for each port of the multi-port memory device is time-multiplexed within the controller to produce a single stream of commands and addresses for different memory requests. The single stream of commands and addresses is transmitted by the controller to the multi-port memory device where the single stream is demultiplexed to generate separate streams of commands and addresses for each port of the multi-port memory device.

20 Claims, 11 Drawing Sheets

CONCEPTUAL DIAGRAM

TIME-MULTIPLEXED COMMUNICATION PROTOCOL FOR TRANSMITTING A COMMAND AND ADDRESS BETWEEN A MEMORY CONTROLLER AND MULTI-PORT MEMORY

BACKGROUND OF THE INVENTION

Field of the Invention

The present invention generally relates to a communication protocol between a memory controller and memory and, more specifically, to a time-multiplexed communication protocol for transmitting a command and address between a memory controller and a multi-port memory device.

Description of the Related Art

The burst length of a memory transaction between a memory controller and a memory such as a dynamic random access memory (DRAM) is determined by the ratio between a first and second frequency. The first frequency is the frequency of the memory interface between a conventional processor and the DRAM. The second frequency is the frequency at which the DRAM core operates. While the second frequency has remained relatively constant, the first frequency has increased with each new generation of DRAM. For example, double data rate (DDR) DRAM that performs four data transfers per clock cycle, e.g., DDR2, uses a minimum burst length of 4 and DDR3 uses a minimum burst length of 8. Assuming the trend continues, the next generation of DRAM may have a minimum burst length of 16 or higher.

As the minimum burst length increases, the minimum amount of data that is transmitted over the memory interface between the DRAM and the processor during a burst, also referred to as "the minimum burst size," increases. For example, the minimum burst size for a 32-bit data interface having a minimum burst length of 8 is 32 bytes. When the minimum burst length increases from 8 to 16, the minimum burst size increases to 64 bytes. Some conventional processors are architected to access data in 32 byte increments. Additionally, the 32 byte increments may not be stored in adjacent memory locations within the DRAM. When the amount of data that is transmitted over the memory interface between the DRAM and the processor during a burst increases from 32 bytes to 64 bytes half of the data may not be needed and is discarded by the processor.

One approach to dealing with the above problem would be to re-architect conventional processors to access data in 64 byte or larger increments. In most scenarios due to underlying constraints, re-architecting is only able to recover part of loss in utilization. Also, as a general matter, re-architecting processors in such a fashion is undesirable for a multitude of reasons, such as time and cost.

As the foregoing illustrates, what is needed in the art is a technique for more effectively handling increases in the minimum burst length associated with memory requests.

SUMMARY OF THE INVENTION

One embodiment of the present invention sets forth a method for transmitting address and commands associated with multiple memory access requests to a dynamic random access memory (DRAM) device. The method includes allocating a first sequence of time slots for transmitting address and command information over a single connection in order to access a first portion of the DRAM device and allocating a second sequence of time slots for transmitting address and command information over the single connection in order to access a second portion of the DRAM device. A first command and a first address associated with a first memory access request are transmitted to the DRAM device over the single connection during a first time slot of the first sequence of time slots. A second command and a second address associated with a second memory access request are transmitted to the DRAM device over the single connection during a first time slot of the second sequence of time slots.

One advantage of the disclosed technique is that the minimum burst size does not increase as the minimum burst length increases. For example, when the minimum burst length increases from 32 to 64, the minimum burst size transmitted over the memory interface in response to each command and address sent by the processor to the DRAM device over the single connection remains at 32 bytes. Therefore, less data is discarded by a processor that is architected to access data in 32 byte increments.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

As the minimum burst length for (DDR) DRAM increases from 8 to 16, the minimum burst size for a 32-bit data interface increases from 32 bytes to 64 bytes. When a controller is architected to access the DRAM in 32 byte increments the communication protocol used to transmit command and address information from the controller to the DRAM may be modified to allow the controller to access the DRAM using a burst length of 16 while receiving or transmitting data in 32 byte increments. The 32-bit data interface is split into two separate data ports to provide two 16-bit data interfaces that each support accesses having a minimum burst size that is half of the minimum burst length for a single 32-bit interface. In other words, for a minimum burst length of 16, the minimum burst size for each of the two 16-bit data interfaces is 32 bytes compared with the minimum burst size for a single 32-bit data interface of 64 bytes.

The number of pins needed to transmit and receive the data is unchanged for two 16-bit data interfaces compared with a single 32-bit data interface. However, independent command and address information is needed for each data port so that the 32 byte increments of data are not constrained to be stored in adjacent memory locations or be otherwise related in a manner that allows a single address to be used to access the two separate data ports. Typically, a dedicated command and address interface is provided for each data interface. However, each additional dedicated command and address interface requires additional pins. Increasing the number of pins may be undesirable because the cost of the device may also increase.

Time-Multiplexed Command and Address Protocol

Figure 1:
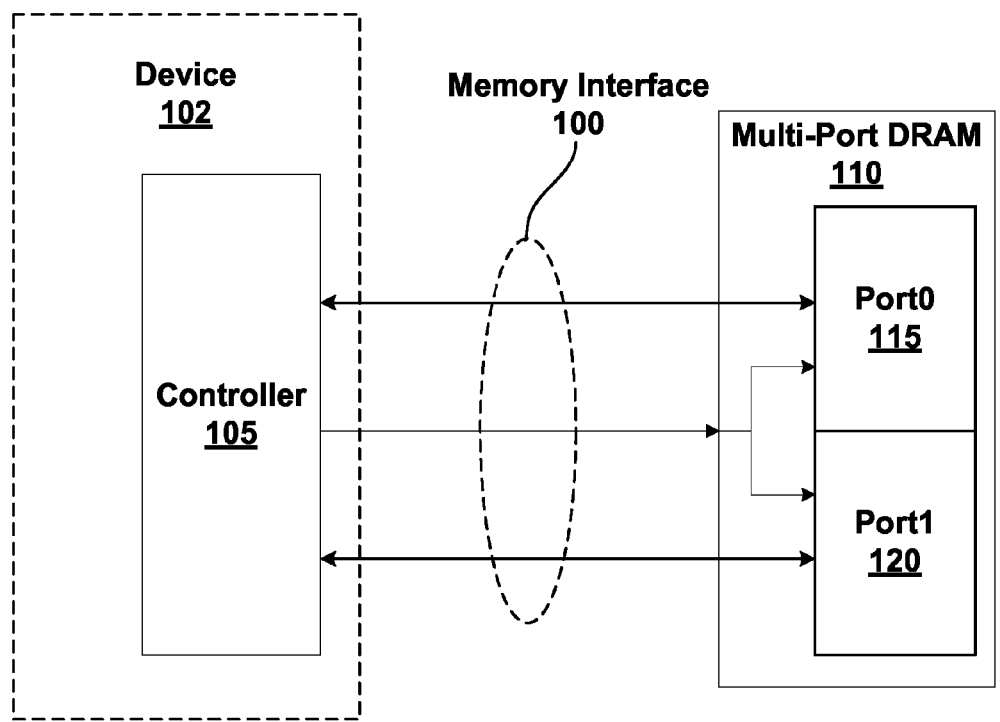
FIG. 1 is a conceptual block diagram of memory interface between and controller and a dual-port DRAM device, according to one embodiment of the present invention.

FIG. 1 is a conceptual block diagram of memory interface 100 between and controller 105 and a multi-port DRAM device 110, according to one embodiment of the present invention. The controller 105 is typically included within a device 102 that is packaged having pins or solder bumps to for each data or control input and/or output, e.g., a processor or a memory bridge device. The multi-port DRAM 110 differs from a conventional DRAM, such as a DDR DRAM because the memory storage within the multi-port DRAM 110 is separated into two independent halves, a port0 115 and a port1 120. Although the multi-port DRAM 110 is shown in FIG. 1 as having only two data ports, in other embodiments, the memory storage may be divided into more than two portions, where each portion is associated with a dedicated data port. A similar multi-port architecture can be used by memory buffer devices that translate a command and address connection (CMD/ADDR) from a controller to a multi-port memory.

The memory interface 100 includes a bi-directional data interface between the controller and the multi-port DRAM 110, where each data interface is associated with a respective data port that accesses a corresponding portion of the memory storage. The memory interface 100 also includes a single communication interface that is configured to support a time-multiplexed communication protocol for transmitting command and address information from the controller 105 to the multi-port DRAM 110. Within the multi-port DRAM 110 the time-multiplexed command and address information is demultiplexed into commands and addresses that are transmitted to the port0 115 and commands and addresses that are transmitted to the port1 120.

Figure 2A:
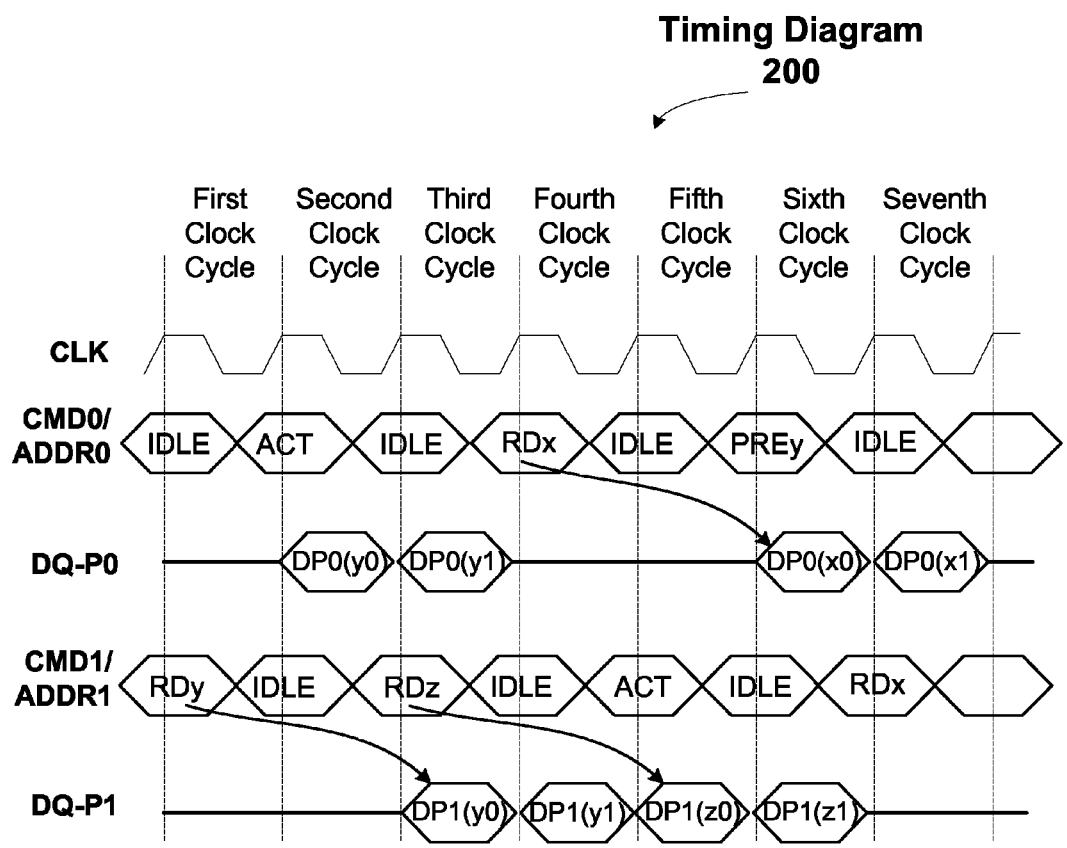
FIG. 2A is a timing diagram of a memory interface between a controller and dual-port memory without time-multiplexing command and address information, according to one embodiment of the present invention.

FIG. 2A is a timing diagram 200 of a memory interface between a controller and a dual-port DRAM device that does not time-multiplex the command and address information for transmission on a single connection, according to one embodiment of the present invention. The dual-port DRAM device receives a clock input (clock), a first command and address connection (CMD0/ADDR0) that is associated with a first bi-directional data connection (DQ-P0), and a second command and address connection (CMD1/ADDR1) that is associated with a second bi-directional data connection (DQ-P1). Commands, addresses, and data for a first port of the dual-port DRAM device can only be provided via CMD0/ADDR0 and DQ-P0. Similarly, commands, addresses, and data for a second port of the dual-port DRAM device can only be provided via CMD1/ADDR1 and DQ-P1.

A typical access protocol for a dual-port DRAM device having a minimum burst length of 16 requires 4 clock cycles between two row activate commands and at least 1 idle clock cycle between two column read/write commands for a GDDR5 interface (or 3 idle clock cycles for a sDDR3 interface). For the example shown in FIG. 2A, a minimum burst length of two is assumed. Therefore, data is transmitted for two consecutive clock cycles for each burst read or write.

A first burst read command, RDy is transmitted on CMD1/ADDR1 during a first clock cycle results in the transmission of DP1($y0$) and DP1($y1$) during the third and fourth clock cycles, respectively. Because the minimum burst length is 2, no data access command is transmitted on the CMD1/ADDR1 during the second clock cycle. As previously explained, at least 1 idle clock cycle must occur between two read or write commands. A second burst read command, RDz that is transmitted on CMD1/ADDR1 during the third clock cycle results in the transmission of DP1($z0$) and DP1($z1$) during the fifth and sixth clock cycles, respectively. The second burst read command is followed by another idle clock cycle.

During the first clock cycle an activate command (ACT) is transmitted on CMD1/ADDR1 to activate a different row of the memory storage corresponding to the second port of the dual-port DRAM device. The activate command is followed by an idle sixth clock cycle. For a multi-bank memory device, a controller is not required to issue a NOP (no operation) commands during an idle clock cycle, but may instead use a slot to send Activate or Precharge command to other rows or banks in the memory device. Due to the constraints imposed by the burst accesses, data access read or write command and address information can only be transmitted on CMD1/ADDR1 during half of the available clock cycles. A similar situation occurs on CMD0/ADDR0.

As shown in the timing diagram 200, an Activate command is transmitted on CMD0/ADDR0 during the second clock cycle. No command is transmitted on CMD0/ADDR0 during the third clock cycle. During the second and third clock cycles DP0($y0$) and DP0($y1$) is transmitted on DQP0 as the result of a previous (not shown) burst read. A burst read command, RDx is transmitted on CMD0/ADDR0 during the fourth clock cycle and results in the transmission of DP0($x0$) and DP0($x1$) during the sixth and seventh clock cycles, respectively. Because the minimum burst length is 2, a second idle clock cycle occurs on the CMD0/ADDR0 connection during the fifth clock cycle. A Precharge command, PREy that is transmitted on CMD0/ADDR0 during the sixth clock cycle to precharge a different column of the memory storage corresponding to the first port of the dual-port DRAM device. The Precharge command is followed by a third idle clock cycle on CMD0/ADDR0 during the seventh clock cycle. As previously noted, the data access read or write command and address information might only be transmitted on CMD0/ADDR0 during half of the available clock cycles due to the constraints imposed by the minimum burst length.

As the minimum burst length increases, the amount of address and command information needed for each burst remains the same. In other words, for a burst read or write of any length, a single command and address is transmitted from the controller to the dual-port DRAM device during one clock cycle. Consequently, as the minimum burst length increases, the ratio of idle command slots to other commands (read, write, activate, precharge, and the like) also increases, so that more of the available bandwidth on CMD0/ADDR0 and CMD1/ADDR1 is consumed transmitting Idle commands than other commands. For example, for a memory device having a minimum burst length of 4, there are 2 command slots available for each burst read or write. Assuming the same clock ratios for a memory device having a minimum burst length of 8, the number of available command slots per burst access increases to 4. A minimum burst Length of 16 increases the number of available command slots to 8. Therefore, as the burst length increases, a single connection may be used to transmit the command and address information for multiple data ports.

Figure 2B:
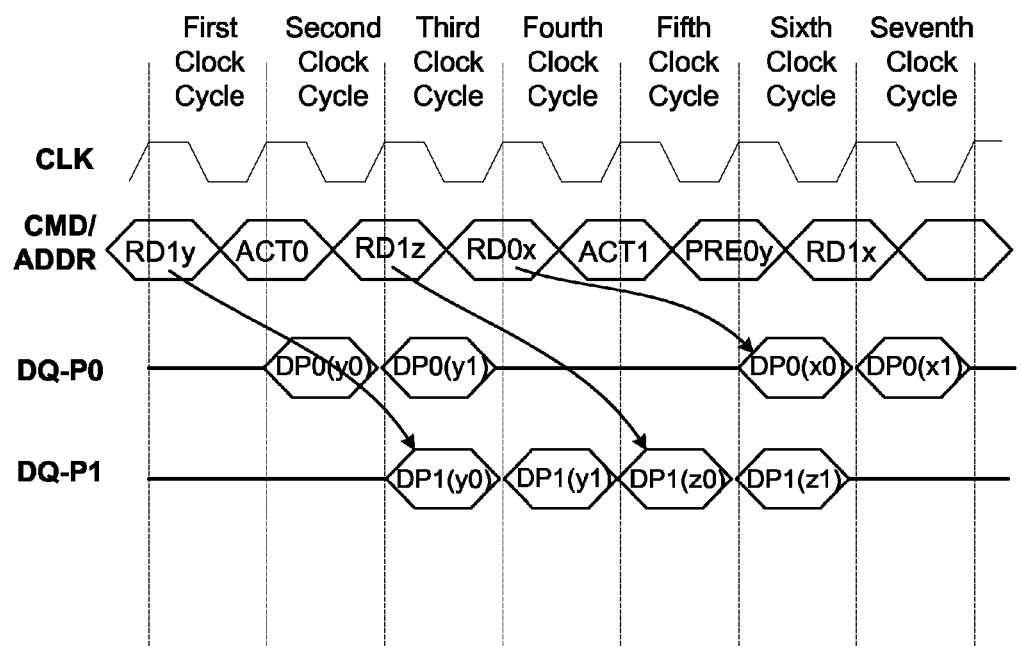
FIG. 2B is a timing diagram of the memory interface of FIG. 1 configured to time-multiplex the address/command signals, according to one embodiment of the present invention.

FIG. 2B is a timing diagram 220 of the memory interface 100 of FIG. 1 between the controller 100 and the multi-port DRAM 110 configured to time-multiplex the command and address information for transmission on a single connection, according to one embodiment of the present invention. In this example, the multi-port DRAM 110 is a dual-port DRAM device.

The dual-port DRAM device receives a clock input (clock), a single stream of command and address information that is transmitted over a single connection, CMD/ADDR. Command and address information that is associated with a first bi-directional data connection (DQ-P0) is time-multiplexed with command and address information that is associated with a second bi-directional data connection (DQ-P1) to generate the single stream. DQ-P0 corresponds with the first port of the dual-port DRAM device and DQ-P1 corresponds with the second port of the dual-port DRAM device.

A first burst read command, RD1y is associated with DQ-P1 and the first port of the dual-port DRAM device and is transmitted on CMD/ADDR during a first clock cycle. RD1y results in the transmission of DP1(y0) and DP1(y1) during the third and fourth clock cycles, respectively. As shown in the timing diagram 220, an activate command, ACT0, for the first port of the dual-port DRAM device is transmitted on CMD/ADDR during the second clock cycle.

A second burst read command, RD1z is associated with DQ-P1 and the second port of the dual-port DRAM device and is transmitted on CMD/ADDR during the third clock cycle. RD1z results in the transmission of DP1(z0) and DP1(z1) during the fifth and sixth clock cycles, respectively. A burst read command, RD0x is associated with DQ-P0 and the first port of the dual-port DRAM device and is transmitted on CMD/ADDR during the fourth clock cycle. RD0x results in the transmission of DP0(x0) and DP0(x1) during the sixth and seventh clock cycles, respectively. A second activate command, ACT1 is associated with DQ-P1 and the second port of the dual-port DRAM device and is transmitted on CMD/ADDR during the fifth clock cycle. A precharge command, PRE0y is transmitted on CMD/ADDR during the sixth clock cycle to precharge a different column of the memory storage corresponding to the first port of the dual-port DRAM device. Lastly, a fourth burst read command, RD1x is associated with DQ-P1 and the second port of the dual-port DRAM device and is transmitted on CMD/ADDR during the seventh clock cycle. RD1x results in the transmission of data on DQ-P1 during a ninth and tenth clock cycles (not shown).

As previously noted, the command and address information for both the first and the second port of the dual-port DRAM device may be transmitted on the single CMD/ADDR connection. Because there are only two ports within the dual-port DRAM device, the time-multiplexing allocates two sequences of exclusive time slots, a first sequence of time slots that are allocated to the first port includes the second, fourth, and sixth clock cycles. A second sequence of time slots that are allocated to the second port includes the first, third, fifth, and seventh clock cycles. When additional ports are included within a multi-port DRAM device, additional sequences of time slots may be allocated to each additional port.

Figure 2C:
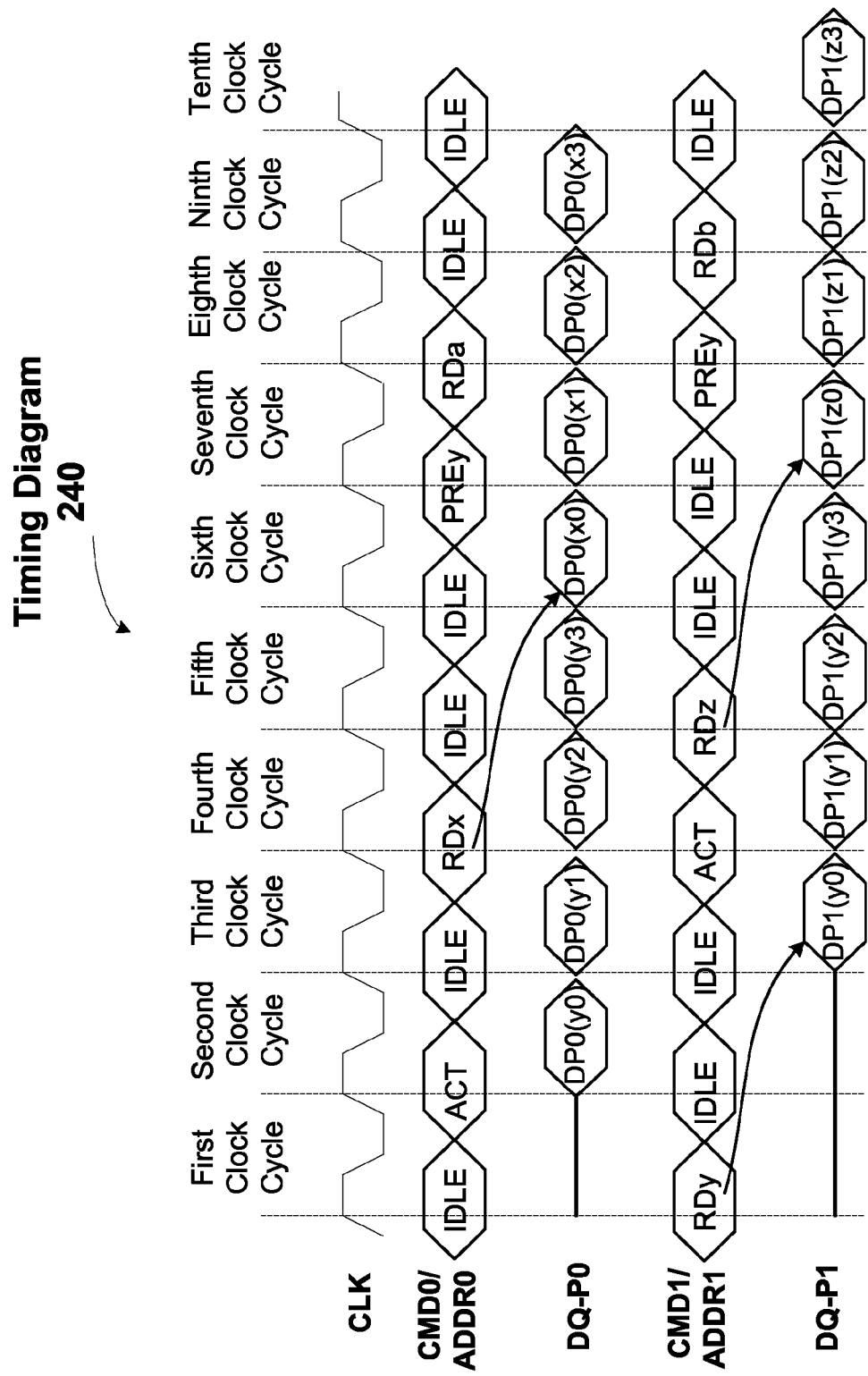
FIG. 2C is another timing diagram of a memory interface between a controller and dual-port memory without time-multiplexing command and address information, according to one embodiment of the present invention.

FIG. 2C is a timing diagram 240 of a memory interface between a controller and dual-port memory without time-multiplexing command and address information, according to one embodiment of the present invention. For the example shown in FIG. 2C, a minimum burst length of four is assumed. Therefore, data is transmitted for four consecutive clock cycles for each burst read or write.

A first burst read command, RDy is transmitted on CMD1/ADDR1 during a first clock cycle results in the transmission of DP1(y0), DP1(y1), DP1(y2), and DP1(y3) during the third, fourth, fifth, and sixth clock cycles, respectively. Because the minimum burst length is 4, no read or write command or address is transmitted on the CMD1/ADDR1 during the second, third, and fourth clock cycles and the CMD1/ADDR1 connection is idle. As previously explained, for a memory device having a minimum burst length of four, at least 3 idle or non data access command clock cycles must occur between two read or write commands. During the fourth clock cycle an activate command (ACT) is transmitted on CMD1/ADDR1 to activate a different row of the memory storage corresponding to the second port of the dual-port DRAM device. The Activate command is transmitted before the next read command to a different bank in the memory device, and could be transmitted during any of the idle clock cycles, namely the second or third clock cycle instead of during the fourth clock cycle.

A second burst read command, RDz that is transmitted on CMD1/ADDR1 during the fifth clock cycle results in the transmission of DP1(z0), DP1(z1), DP1(z2), and DP1(z3) during the seventh, eighth, ninth, and tenth clock cycles, respectively. The second burst read command is followed by two more idle clock cycles on the CMD1/ADDR1 connection. A Precharge command, PREy and a read command RDb are transmitted on the CMD1/ADDR1 connection during the eighth clock cycle and the ninth clock cycle, respectively. Due to the constraints imposed by the burst length, read and write command and address information might only be transmitted on CMD1/ADDR1 during a quarter of the available clock cycles, leaving three command clock cycles idle or available for other commands like Activate and Precharge. A similar situation occurs on CMD0/ADDR0.

As shown in the timing diagram 240, an activate command is transmitted on CMD0/ADDR0 during the second clock cycle. The CMD0/ADDR0 connection is idle during the third clock cycle. During the second, third, fourth, and fifth clock cycles DP0($y$0), DP0($y$1), DP0($y$2), and DP0($y$3) are transmitted on DQP0 as the result of a previous (not shown) burst read. The first idle clock cycle is followed by a burst read command, RDx that is transmitted on CMD0/ADDR0 during the fourth clock cycle and results in the transmission of DP0($x$0), DP0($x$1), DP0($x$0), and DP0($x$1) during the sixth, seventh, eighth, and ninth clock cycles, respectively. Because the minimum burst length is 4, no read or write command or address is transmitted on the CMD0/ADDR0 connection during the fifth or sixth clock cycles. The two idle clock cycles are followed by a precharge command, PREy that is transmitted on CMD0/ADDR0 during the seventh clock cycle to precharge a different column of the memory storage corresponding to the first port of the dual-port DRAM device. The precharge command is transmitted before the next read or write command, and could be transmitted during either the fifth or sixth clock cycle instead of during the seventh clock cycle. The precharge command is followed by another read command, RDa and the CMD0/ADDR0 connection is idle after the RDa command is transmitted. As previously noted, the command and address information might only be transmitted on CMD0/ADDR0 during a quarter of the available clock cycles due to the constraints imposed by the minimum burst length.

Figure 2D:
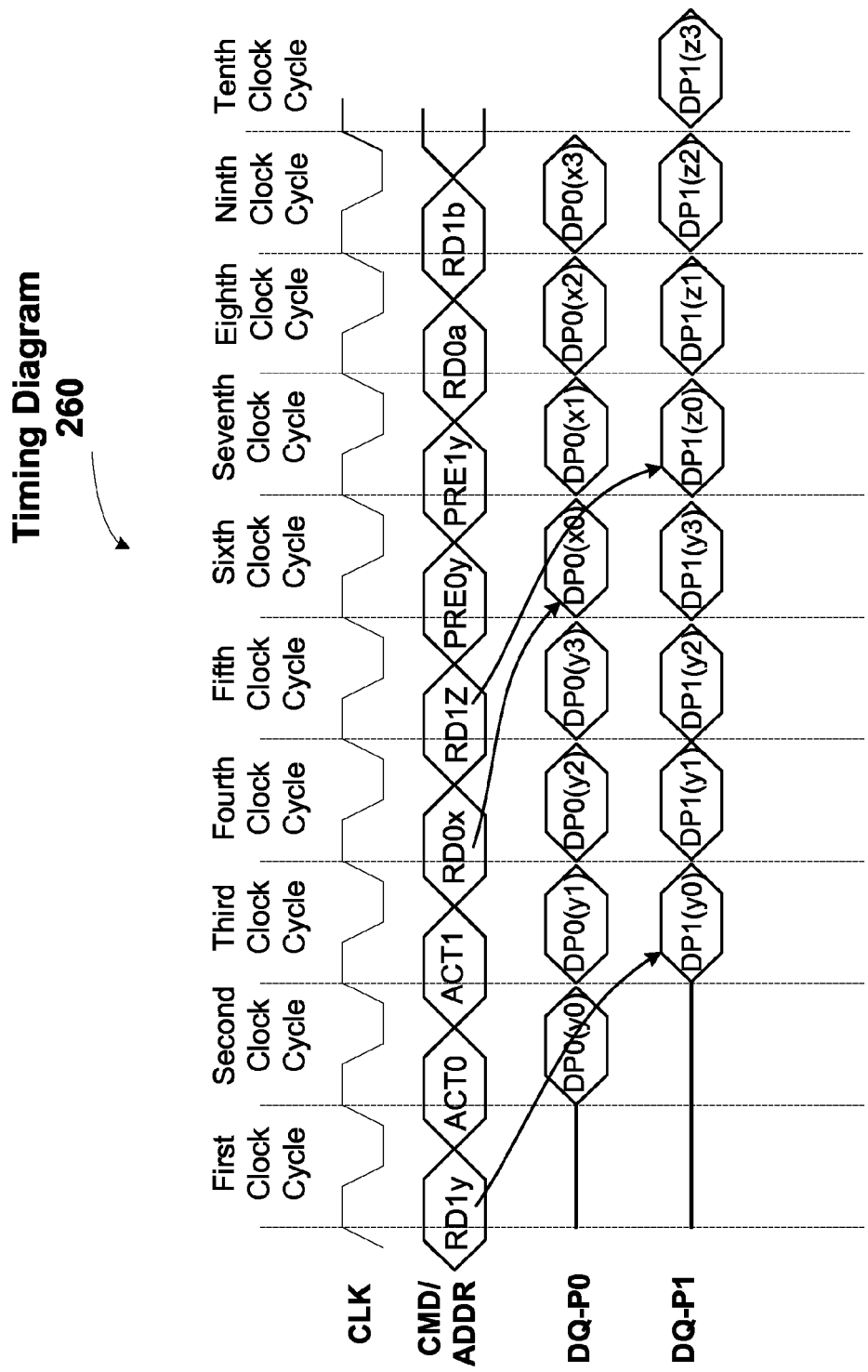
FIG. 2D is another timing diagram of the memory interface of FIG. 1 configured to time-multiplex the address/command signals, according to one embodiment of the present invention.

FIG. 2D is a timing diagram 260 of the memory interface 100 of FIG. 1 configured to time-multiplex the address/command signals, according to one embodiment of the present invention. In this example, the multi-port DRAM 110 is a dual-port DRAM device supporting a minimum burst length of four. A first burst read command, RD1$y$ is associated with DQ-P1 and the first port of the dual-port DRAM device and is transmitted on CMD/ADDR during a first clock cycle. RD1$y$ results in the transmission of DP1($y$0), DP1($y$1), DP1($y$2), and DP1($y$3) during the third, fourth, fifth, and sixth clock cycles, respectively. As shown in the timing diagram 260, an activate command, ACT0, for the first port of the dual-port DRAM device is transmitted on CMD/ADDR during the second clock cycle. A second activate command, ACT1 is associated with DQ-P1 and the second port of the dual-port DRAM device and is transmitted on CMD/ADDR during the third clock cycle.

A second burst read command, RD0$x$ is associated with DQ-P0 and the first port of the dual-port DRAM device and is transmitted on CMD/ADDR during the fourth clock cycle. RD0$x$ results in the transmission of DP0($x$0), DP0($x$1), DP0($x$2), and DP0($x$3) during the sixth, seventh, eighth, and ninth clock cycles, respectively. A third burst read command, RD1$z$ is associated with DQ-P1 and the second port of the dual-port DRAM device and is transmitted on CMD/ADDR during the fifth clock cycle. RD1$z$ results in the transmission of DP1($z$0), DP1($z$1), DP1($z$2), and DP1($z$3) during the seventh, eighth, ninth, and tenth clock cycles, respectively. A first precharge command, PRE0$y$ is transmitted on CMD/ADDR during the sixth clock cycle to precharge a different column of the memory storage corresponding to the first port of the dual-port DRAM device. A second precharge command, PRE1$y$ is transmitted on CMD/ADDR during the seventh clock cycle to precharge a different column of the memory storage corresponding to the second port of the dual-port DRAM device. A fourth burst read command, RD0$a$ is associated with DQ-P0 and the first port of the dual-port DRAM device and is transmitted on CMD/ADDR during the eighth clock cycle. RD0$a$ results in the transmission of data on DQ-P0 during the tenth, eleventh, twelfth, and thirteenth clock cycles (not shown). Lastly, a fourth burst read command, RD1$b$ is associated with DQ-P1 and the second port of the dual-port DRAM device and is transmitted on CMD/ADDR during the ninth clock cycle. RD1$b$ results in the transmission of data on DQ-P1 during later clock cycles (not shown).

Figure 2E:
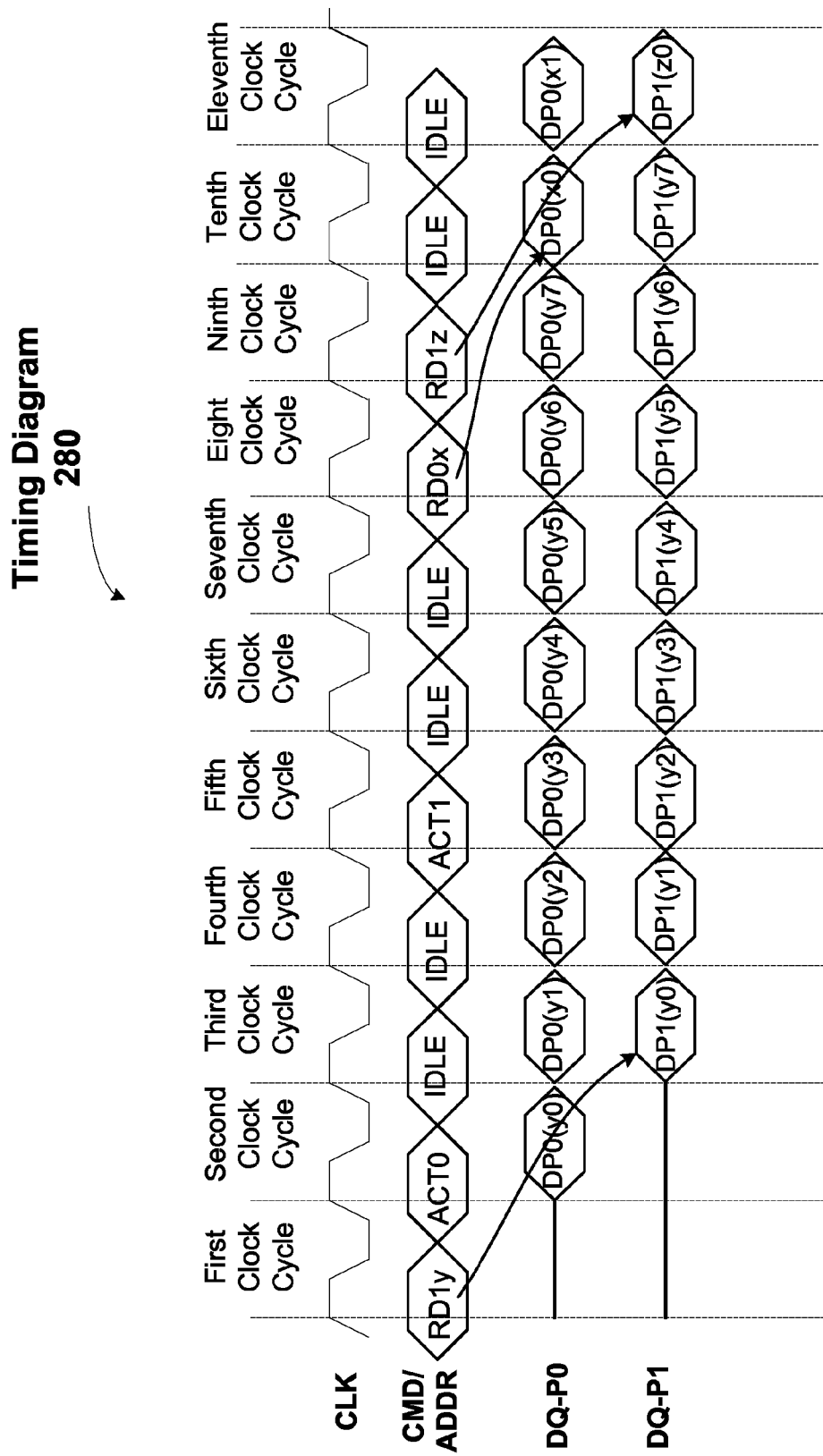
FIG. 2E is another timing diagram of the memory interface of FIG. 1 configured to time-multiplex the address/command signals, according to one embodiment of the present invention.

FIG. 2E is a timing diagram 280 of the memory interface 100 of FIG. 1 configured to time-multiplex the address/command signals, according to one embodiment of the present invention. In this example, the multi-port DRAM 110 is a dual-port DRAM device supporting a minimum burst length of eight. A first burst read command, RD1$y$ is associated with DQ-P1 and the first port of the dual-port DRAM device and is transmitted on CMD/ADDR during a first clock cycle. RD1$y$ results in the transmission of DP1($y$0), DP1($y$1), DP1($y$2), DP1($y$3), DP1($y$4), DP1($y$5), DP1($y$6), and DP1($y$7) during the third, fourth, fifth, sixth, seventh, eighth, ninth, and tenth clock cycles, respectively. As shown in the timing diagram 280, an activate command, ACT0, for the first port of the dual-port DRAM device is transmitted on CMD/ADDR during the second clock cycle. A second activate command, ACT1 is associated with DQ-P1 and the second port of the dual-port DRAM device and is transmitted on CMD/ADDR during the fourth clock cycle.

A second burst read command, RD0$x$ is associated with DQ-P0 and the first port of the dual-port DRAM device and is transmitted on CMD/ADDR during the eighth clock cycle. RD0$x$ results in the transmission of DP0($x$0), DP0($x$1), and six more portions of data (not shown) during the tenth through seventeenth clock cycles, respectively. A third burst read command, RD1$z$ is associated with DQ-P1 and the second port of the dual-port DRAM device and is transmitted on CMD/ADDR during the ninth clock cycle. RD1$z$ results in the transmission of DP1($z$0) and seven more portions of data (not shown) during the eleventh through eighteenth clock cycles, respectively. A first activate command, ACT0 is transmitted on CMD/ADDR during the third clock cycle to activate a different row of the memory storage corresponding to the first port of the dual-port DRAM device. A second activate command, ACT1 is transmitted on CMD/ADDR during the fifth clock cycle to activate a different row of the memory storage corresponding to the second port of the dual-port DRAM device. In addition to the two activate commands there are four idle clock cycles on CMD/ADDR between the first and second burst read commands. The timing of commands other than read and write commands is strictly dependent on the memory protocol. The location of the idle and activate cycles shown in FIGS. 2B, 2D, and 2E are one of many possible for a given memory interface. As previously described, the timing of read and write commands is strictly controlled based on the minimum burst length and in the example shown in FIG. 2E the read and write commands for each data port must be at least 8 clock cycles apart leaving seven clock cycles for transmitting other commands.

As demonstrated by the previous examples, as the minimum burst length increases, a single connection may be used to transmit the command and address information for multiple data ports. More specifically, as shown in the timing diagram 280 the number of data ports may also increase as the minimum burst length increases without adding additional CMD/ADDR ports. This allows for an efficient memory system that can manage the increase in minimum burst length without increasing the number of command and address signals or the minimum access size for the controller.

The Controller

Figure 3A:
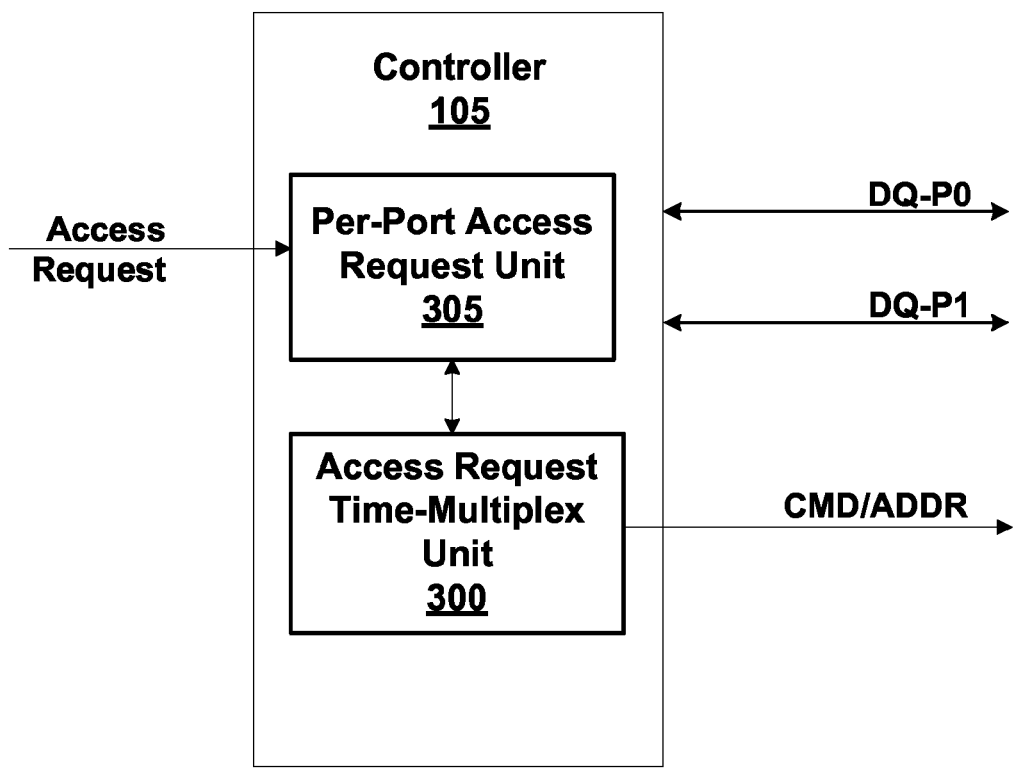
FIG. 3A is a block diagram of the controller of FIG. 1, according to one embodiment of the present invention.

FIG. 3A is a block diagram of the controller 105 of FIG. 1, according to one embodiment of the present invention. The controller 105 receives memory access requests to read data from and write data to the multi-port DRAM 110. The controller 105 includes at least a per-port access request unit 305 and an access request time-multiplex unit 300. The per-port access request unit is configured to sort the access requests based on an address that is provided with each access request. The address may be a virtual address that is translated by the per-port access request unit 305 into a physical address of the multi-port DRAM 110. Each port of the multi-port DRAM 110 is associated with a different set of addresses. Once the per-port access request unit 305 determines which port within the multi-port DRAM 110 that a particular access request will be transmitted to, the particular access request is buffered with other access requests for transmission to the same port. The per-port buffered access requests are provided by the per-port access request unit 305 to the access request time-multiplex unit 300. In one embodiment, contents of each per-port buffer may be reordered. In other embodiments, the per-port ordering of the read and write access requests received by the per-port access request unit 305 is maintained and the contents of each per-port buffer are not reordered.

The access request time-multiplex unit 300 is configured to allocate a different sequence of time slots for the transmission of command and address information for each port of the multi-port DRAM 110. Each time slot is allocated to a single one of the multiple ports. The time slots may be allocated in round-robin order to produce the different sequences of time slots. In other embodiments, different ordering patterns may be used, including ordering patterns that allow for the allocation of more time slots to one port compared with another port. Regardless of the pattern used to allocate the time slots, the controller 105 should coordinate with the multi-port DRAM 110 to ensure that the stream of command and address information is demultiplexed and directed to the correct port. Therefore, a training mechanism is executed between the controller 105 and the multi-port DRAM 110 before a command and address is transmitted on the single CMD/ADDR connection. The training mechanism ensures that the time slots are synchronized between the controller 105 and the multi-port DRAM 110.

The access request time-multiplex unit 300 fills each clock cycle (or time slot) with command and address information for the appropriate port to generate the single stream of command and address information that is transmitted on CMD/ADDR. In addition to read and write access requests, the command and address information also encodes operations such as precharge, activate, and NOP commands. The per-port access request unit 305 is configured to generate the precharge, activate, and NOP commands as needed to access the multi-port DRAM 110 and insert the precharge, activate, and NOP commands into the per-port buffers. The precharge and activate commands correspond with addresses that are also transmitted on the CMD/ADDR connection just as an address is transmitted on the CMD/ADDR connection for read and write commands.

The access request time-multiplex unit 300 selects command and address information for a port from one of the buffers for each clock cycle based on the allocated sequences of time slots. When a buffer is empty for a particular time slot, the time-multiplex unit 300 inserts a NOP into the time slot to generate the stream of commands and addresses that is transmitted on CMD/ADDR. The command and the address information is typically encoded as a multi-bit signal.

Figure 3B:
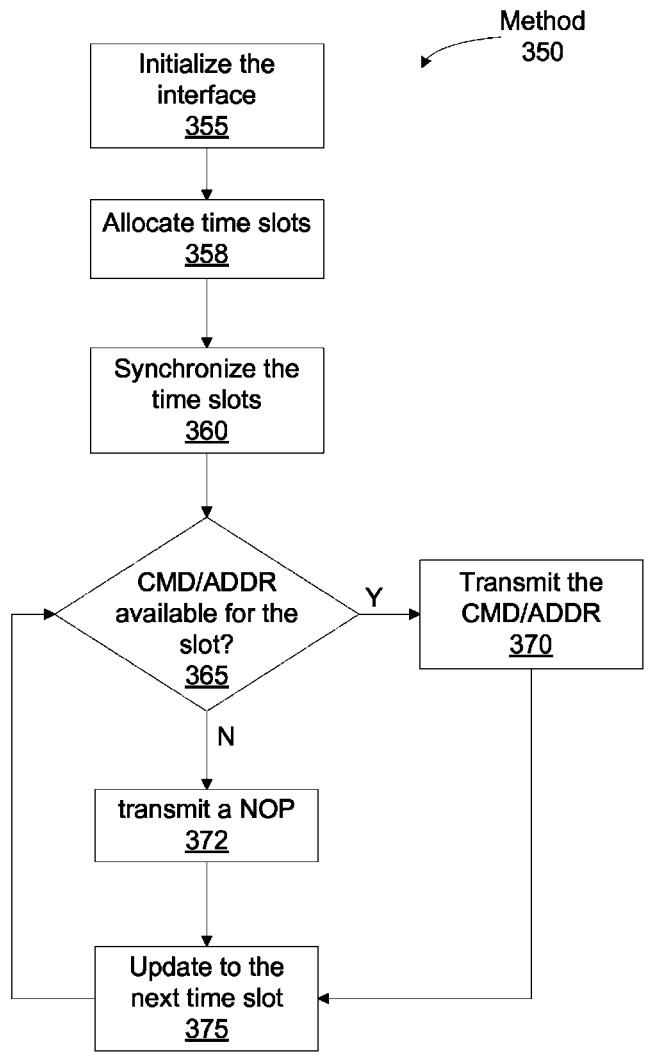
FIG. 3B sets forth a flow diagram of method steps describing a technique for transmitting time-multiplexed address/command signals from the controller to a dual-port DRAM device over the memory interface, according to one embodiment of the present invention.

FIG. 3B sets forth a flow diagram of method steps describing a technique for transmitting time-multiplexed command and address information from the controller 105 to a dual-port DRAM device 110 over the memory interface 100, according to one embodiment of the present invention. Although the method steps are described in conjunction with the systems of FIGS. 1 and 3A, persons of ordinary skill in the art will understand that any system configured to perform the method steps, in any order, is within the scope of the inventions.

The method 350 begins at step 355, where the access request time-multiplex unit 300 initializes the memory interface 100 by transmitting a reset command to the multi-port DRAM 110 via the CMD/ADDR. At step 358 the access request time-multiplex unit 300 allocates sequences of time slots for each one of the ports of the multi-port DRAM 110. The allocation of the sequences of time slots to each port specifies the pattern that is used to fill the time slots. At step 360 the access request time-multiplex unit 300 synchronizes the time slots to indicate the first slot that will be transmitted and received on CMD/ADDR. The access request time-multiplex unit 300 may set a slot counter to a predetermined value to synchronize the time slots and transmit a synchronize command to set a slot counter in the multi-port DRAM 110 to the same predetermined value. The slot counter may be used to determine the port to which each slot is allocated in order to fill the slot with command and address information.

At step 365 the access request time-multiplex unit 300 determines if a command and address is available for the port to which the first time slot is allocated, and, if not, then at step 372 the access request time-multiplex unit 300 transmits a NOP command to fill the first time slot in the stream of commands and addresses that are transmitted from the controller 105 to the multi-port DRAM 110 on the single connection CMD/ADDR. If, at step 365 the access request time-multiplex unit 300 determines that a command and address is available for the port to which the first time slot is allocated, then at step 370 the access request time-multiplex unit 300 fills the first time slot with the command and address.

At step 375 the access request time-multiplex unit 300 updates to the next time slot before returning to step 365. A filled time slot is transmitted for each clock cycle to generate the single stream of commands and address information. Each time slot is allocated to a particular port based on the allocated sequences. When a command and address is available in the buffer for the particular port during a time slot that is allocated to the particular port, the time slot is filled with the command and address from the buffer. Otherwise, the time slot is filled with a NOP command.

The Multi-Port DRAM Device

Figure 4A:
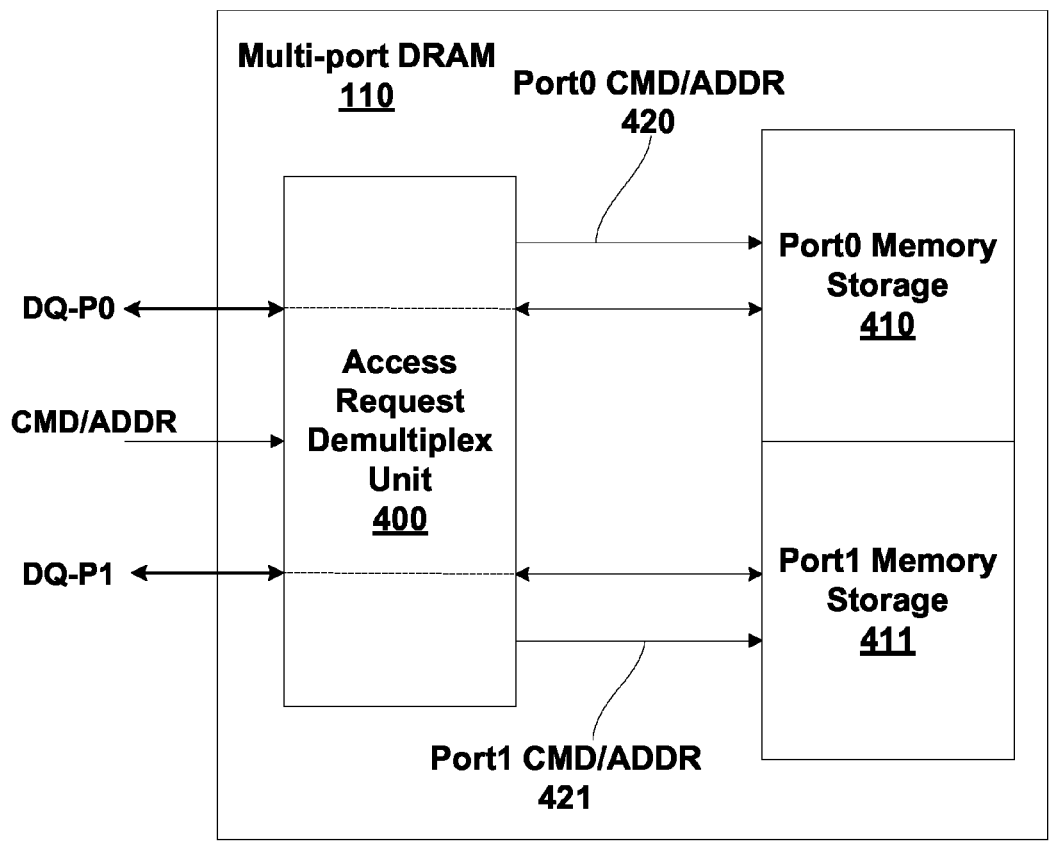
FIG. 4A is a block diagram of the dual-port DRAM device of FIG. 1, according to one embodiment of the present invention.

FIG. 4A is a block diagram of the multi-port DRAM device 110 of FIG. 1, according to one embodiment of the present invention. The multi-port DRAM device 110 receives the time-multiplexed stream of commands and addresses from the controller 105. The multi-port DRAM device 110 includes at least an access request demultiplex unit 400 and memory storage divided into two or more portions, e.g., port0 memory storage 410 and port1 memory storage 411. The port0 memory storage 410 is accessed through a first data port DQ-P0 and the port1 memory storage 411 is accessed through a second data port DQ-P1. In one embodiment, the first data port and the second data port are each 16-bits wide and the minimum burst length is 8, 16, or 32 clock cycles so that the minimum burst size is 16 bytes, 32 bytes, or 64 bytes, respectively.

The access request demultiplex unit 400 is configured to receive the time-multiplexed stream of commands and addresses and direct each individual command and address to the appropriate port based on the time slot. For example, a command and address received in a time slot that is allocated to the port0 memory storage 410 is transmitted to the port0 memory storage 410 via a port0 CMD/ADDR 420 connection within the multi-port DRAM 110. Similarly, a command and address received in a time slot that is allocated to the port1 memory storage 411 is transmitted to the port1 memory storage 411 via a port1 CMD/ADDR 421 connection within the multi-port DRAM 110. Because the commands and addresses are directed to a port based on the time slot instead of the address, the address does not need to uniquely identify the port. The address only needs to uniquely identify a location within the port as needed for the command.

As previously described in conjunction with FIG. 2A, the access request time-multiplex unit 300 allocates a different sequence of time slots for the transmission of command and address information for each port of the multi-port DRAM 110. The controller 105 then coordinates with the multi-port DRAM 110 using a training mechanism to ensure that when the stream of command and address information is demultiplexed each command and address is directed to the correct port.

Figure 4B:
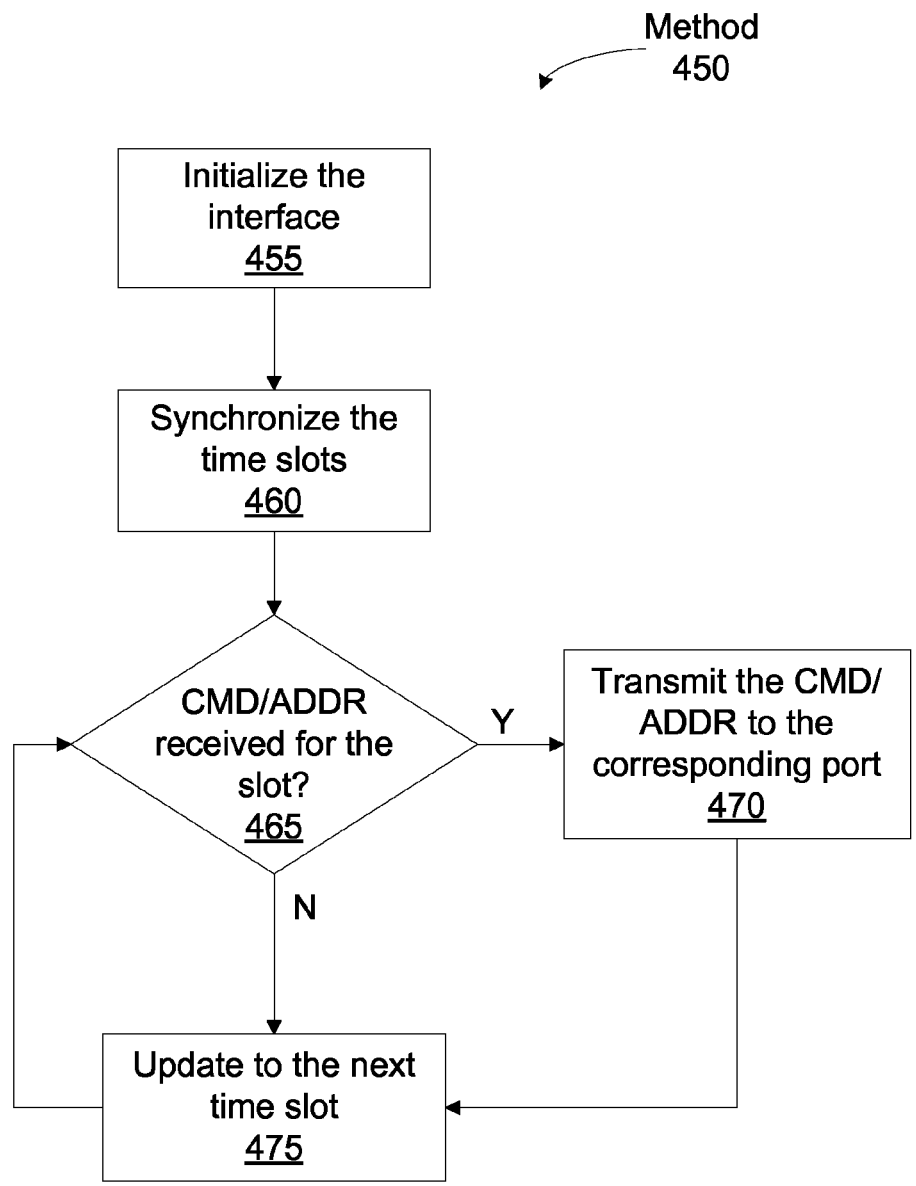
FIG. 4B sets forth a flow diagram of method steps describing a technique for demultiplexing time-multiplexed address/command signals received by a dual-port DRAM device from a controller, according to one embodiment of the present invention.

FIG. 4B is a flowchart of method steps describing a technique for demultiplexing a time-multiplexed command and address stream received by the dual-port DRAM device 110 from the controller 105, according to one embodiment of the present invention. Although the method steps are described in conjunction with the systems of FIGS. 1, 3A, and 4A, persons of ordinary skill in the art will understand that any system configured to perform the method steps, in any order, is within the scope of the inventions.

The method 450 begins at step 455, where the access request demultiplex unit 400 receives a reset command from the controller 105 via the CMD/ADDR. At step 460 the access request demultiplex unit 400 synchronizes the time slots when a synchronization command is received from the controller 105 that indicates the first slot that will be transmitted on CMD/ADDR. The access request demultiplex unit 400 may set a slot counter to a predetermined value to synchronize the time slots when the synchronize command is received. The slot counter may be used by the access request demultiplex unit 400 to determine the port to which each time slot is allocated.

At step 465 the access request demultiplex unit 400 determines if a command and address is available in the first time slot, and, if not, then at step 475 the access request demultiplex unit 400 updates to the next time slot before returning to step 465. The access request demultiplex unit 400 may be configured to update to the next time slot by incrementing the slot counter. If, at step 465, the access request demultiplex unit 400 determines that a command and address is available in the first time slot, then at step 470 the access request demultiplex unit 400 transmits the command and address to the port to which the first slot is allocated. Steps 465, 470, and 475 are repeated for each clock cycle to demultiplex the single stream of commands and address information into individual commands and addresses for each of the different ports within the multi-port DRAM 110.

System Overview

Figure 5:
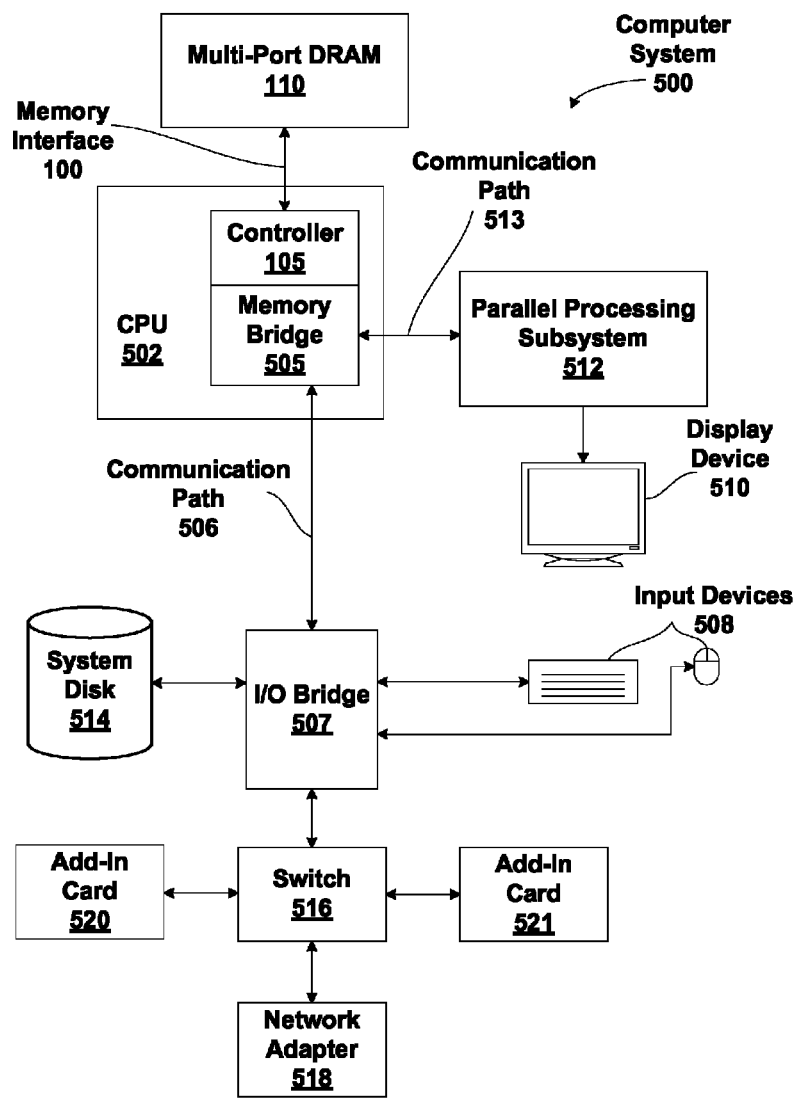
FIG. 5 is a block diagram illustrating a computer system configured to implement one or more aspects of the present invention.

FIG. 5 is a block diagram illustrating a computer system 600 configured to implement one or more aspects of the present invention. Computer system 500 includes a central processing unit (CPU) 502 and a multi-port DRAM 110 communicating via the memory interface 100 that may include a memory bridge 505. Memory bridge 505, which may be, e.g., a Northbridge chip, is connected via a bus or other communication path 506 (e.g., a HyperTransport link) to an I/O (input/output) bridge 507. The memory bridge 505 is coupled to or integrated with a controller 105 for communication with the multi-port DRAM 110 via the memory interface 100. The memory interface 100 includes a single connection configured to transmit a stream of commands and addresses from the controller 105 to the multi-port DRAM 110.

I/O bridge 507, which may be, e.g., a Southbridge chip, receives user input from one or more user input devices 508 (e.g., keyboard, mouse) and forwards the input to CPU 502 via communication path 506 and memory bridge 505. A parallel processing subsystem 512 is coupled to memory bridge 505 via a bus or second communication path 513 (e.g., a Peripheral Component Interconnect (PCI) Express, Accelerated Graphics Port, or HyperTransport link); in one embodiment parallel processing subsystem 512 is a graphics subsystem that delivers pixels to a display device 510 (e.g., a conventional cathode ray tube or liquid crystal display based monitor). A system disk 514 is also connected to I/O bridge 507. A switch 516 provides connections between I/O bridge 507 and other components such as a network adapter 518 and various add-in cards 520 and 521. Other components (not explicitly shown), including universal serial bus (USB) or other port connections, compact disc (CD) drives, digital versatile disc (DVD) drives, film recording devices, and the like, may also be connected to I/O bridge 507. The various communication paths shown in FIG. 5, including the specifically named communication paths 506 and 513 may be implemented using any suitable protocols, such as PCI Express, AGP (Accelerated Graphics Port), HyperTransport, or any other bus or point-to-point communication protocol(s), and connections between different devices may use different protocols as is known in the art.

In one embodiment, the parallel processing subsystem 512 incorporates circuitry optimized for graphics and video processing, including, for example, video output circuitry, and constitutes a graphics processing unit (GPU). In another embodiment, the parallel processing subsystem 512 incorporates circuitry optimized for general purpose processing, while preserving the underlying computational architecture. In yet another embodiment, the parallel processing subsystem 512 may be integrated with one or more other system elements in a single subsystem, such as joining the memory bridge 505, CPU 502, and I/O bridge 507 to form a system on chip (SoC).

It will be appreciated that the system shown herein is illustrative and that variations and modifications are possible. The connection topology, including the number and arrangement of bridges, the number of CPUs 502, and the number of parallel processing subsystems 512, may be modified as desired. For instance, in other alternative topologies, parallel processing subsystem 512 is connected to I/O bridge 507 or directly to CPU 502, rather than to memory bridge 505. In still other embodiments, I/O bridge 507 and memory bridge 505 might be integrated into a single chip instead of existing as one or more discrete devices. Large embodiments may include two or more CPUs 502 and two or more parallel processing subsystems 512. The particular components shown herein are optional; for instance, any number of add-in cards or peripheral devices might be supported. In some embodiments, switch 516 is eliminated, and network adapter 518 and add-in cards 520, 521 connect directly to I/O bridge 507.

In sum, the memory interface 100 between the CPU 502 and the multi-port DRAM 110 includes a connection to transmit two or more individual command and address streams over a single shared command and address connection from a controller to a multi-port DRAM by time-multiplexing commands and addresses for individual ports of the multi-port DRAM 110. Each individual command and address stream is allocated a sequence of time slots for transmitting. The multi-port DRAM demultiplexes the individual command and address streams and provides each individual command and address stream to a corresponding port memory storage within the DRAM device. Separate connections are provided between the controller and the DRAM to transmit data to/from each port memory storage. The number of ports in the multi-port DRAM may determine the frequency of the time-multiplexing, e.g., two different address/command signals are time-multiplexed to access two ports, three different address/command signals are time-multiplexed to access three ports, and so on.

One advantage of the disclosed technique is that the minimum burst size does not increase as the minimum burst length increases. For example, when the minimum burst length increases from 32 to 64, the minimum burst size transmitted over the memory interface in response to each command and address sent by the processor to the DRAM device over the single connection remains at 32 bytes. Therefore, less data is discarded by a processor that is architected to access data in 32 byte increments. Beneficially, no additional pins are needed on either the device that includes the controller or on the multi-ported memory device to provide the single connection. Additionally, existing DRAM memory architectures may be configured to support the single connection by integrating an access request demultiplex unit 400 between the single connection and the existing control interfaces corresponding to each port memory storage. Similarly, existing processor architectures may be configured to support the single connection by integrating a controller 300 between the existing control interface and the single connection.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as compact disc read only memory (CD-ROM) disks readable by a CD-ROM drive, flash memory, read only memory (ROM) chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

The invention claimed is:

1. A method for transmitting address and commands associated with multiple memory access requests to a dynamic random access memory (DRAM) device, the method comprising:
   allocating, at a memory controller, a first sequence of time slots, according to a predetermined pattern that allocates time slots across a first port of the DRAM device and a second port of the DRAM device, for transmitting address and command information over a single connection in order to access the first port of the DRAM device via a first data connection;
   allocating a second sequence of time slots, according to the predetermined pattern, for transmitting address and command information over the single connection in order to access the second port of the DRAM device via a second data connection;
   transmitting, from the memory controller, a first command and a first address associated with a first memory access request to the DRAM device over the single connection during a first time slot of the first sequence of time slots; and
   transmitting a second command and a second address associated with a second memory access request to the DRAM device over the single connection during a first time slot of the second sequence of time slots.

2. The method of claim 1, further comprising transmitting a reset command to the DRAM device over the single connection in order to initialize the single connection.

3. The method of claim 1, further comprising synchronizing with the DRAM device to indicate the first time slot that will be transmitted on the single connection.

4. The method of claim 1, further comprising:
   determining that a command and address associated with the first port of the DRAM device is not available to fill a second time slot of the first sequence of time slots; and
   transmitting a no operation command to the DRAM device over the single connection during the second time slot of the first sequence of time slots.

5. The method of claim 1, wherein the first memory access reads or writes the first port of the DRAM device and the second memory access reads or writes the second port of the DRAM device.

6. The method of claim 1, wherein the first port of the DRAM device is accessed through a first 16-bit data port and the second port of the DRAM device is accessed through a second 16-bit data port.

7. The method of claim 1, wherein a minimum amount of data received from the DRAM device in response to the first memory access request is 32 bytes over 16 clock cycles.

8. The method of claim 1, wherein:
the first sequence and the second sequence comprise the predetermined pattern of time slots that is predetermined based on a number of ports of the DRAM device.

9. The method of claim 8, wherein:
the predetermined pattern of time slots allocates time slots for the first port of the DRAM device and the second port of the DRAM device in a round-robin order.

10. The method of claim 8, wherein:
the predetermined pattern of time slots allocates more time slots for the first port of the DRAM device than for the second port of the DRAM device.

11. A processing subsystem, comprising:
controller that is configured to:
allocate a first sequence of time slots, according to a predetermined pattern that allocates time slots across a first port of the DRAM device and a second port of the DRAM device, for address and command information over a single connection in order to access the first port of a dynamic random access memory (DRAM) device via a first data connection;
allocate a second sequence of time slots, according to the predetermined pattern, for address and command information over the single connection in order to access the second port of the DRAM device via a second data connection;
transmit a first command and a first address associated with a first memory access request to the DRAM device over the single connection during a first time slot of the first sequence of time slots; and
transmit a second command and a second address associated with a second memory access request to the DRAM device over the single connection during a first time slot of the second sequence of time slots.

12. The processing subsystem of claim 11, wherein the controller is further configured to transmit a reset command to the DRAM device over the single connection in order to initialize the single connection.

13. The processing subsystem of claim 11, wherein the controller is further configured to synchronize with the DRAM device to indicate the first time slot that will be transmitted on the single connection.

14. The processing subsystem of claim 11, herein the controller is further configured to:
determine that a command and address associated with the first port of the DRAM device is not available to fill a second time slot of the first sequence of time slots; and
transmit a no operation command to the DRAM device over the single connection during the second time slot of the first sequence of time slots.

15. The processing subsystem of claim 11, wherein the first memory access reads or writes the first port of the DRAM device and the second memory access reads or writes the second port of the DRAM device.

16. The processing subsystem of claim 11, wherein the first port of the DRAM device is accessed through a first 16-bit data port and the second port of the DRAM device is accessed through a second 16-bit data port.

17. The processing subsystem of claim 11, wherein a minimum amount of data received from the DRAM device in response to the first memory access request is 32 bytes over 16 clock cycles.

18. A computing system, comprising:
a dynamic random access memory (DRAM) device; and
a processing subsystem comprising a controller that is configured to:
allocate a first sequence of time slots, according to a predetermined pattern that allocates time slots across a first port of the DRAM device and a second port of the DRAM device, for address and command information over a single connection in order to access the first port of a dynamic random access memory (DRAM) device via a first data connection;
allocate a second sequence of time slots, according to the predetermined pattern, for address and command information over the single connection in order to access the second port of the DRAM device via a second data connection;
transmit a first command and a first address associated with a first memory access request to the DRAM device over the single connection during a first time slot of the first sequence of time slots; and
transmit a second command and a second address associated with a second memory access request to the DRAM device over the single connection during a first time slot of the second sequence of time slots.

19. The computing system of claim 18, wherein the controller is further configured to transmit a reset command to the DRAM device over the single connection in order to initialize the single connection.

20. The computing system of claim 18, wherein the controller is further configured to synchronize with the DRAM device to indicate the first time slot that will be transmitted on the single connection.

* * * * *